United States Patent
Tsai-Sen et al.

[11] Patent Number: 6,133,155
[45] Date of Patent: Oct. 17, 2000

[54] METHOD FOR PREVENTING CORROSION OF A METALLIC LAYER OF A SEMICONDUCTOR CHIP

[75] Inventors: Lin Tsai-Sen, Taichung; Chou-Shin Jou, Hsin-Chu; Tings Wang, Hsin-Chu Hsien; Chin-Kang Li, Yun-Lin Hsien, all of Taiwan

[73] Assignee: Mosel Vitelic Inc., Hsin-Chu, Taiwan

[21] Appl. No.: 09/198,308

[22] Filed: Nov. 23, 1998

[30] Foreign Application Priority Data

Oct. 13, 1998 [TW] Taiwan ................... 87116936

[51] Int. Cl.[7] .................................. H01L 21/3065
[52] U.S. Cl. .................. 438/706; 438/710; 438/714; 438/715
[58] Field of Search ..................... 438/745, 750, 438/753, 704, 706, 720, 653, 652

[56] References Cited

U.S. PATENT DOCUMENTS

| 5,667,630 | 9/1997 | Lo | 438/653 |
|---|---|---|---|
| 5,840,203 | 11/1998 | Peng | 216/66 |
| 5,902,780 | 5/1999 | Lee | 510/176 |

*Primary Examiner*—Benjamin L. Utech
*Assistant Examiner*—Lan Vinh
*Attorney, Agent, or Firm*—Winston Hsu

[57] ABSTRACT

The present invention provides a method for preventing corrosion of an aluminum-containing metallic layer having a plurality of trenches on the surface of a semiconductor chip caused by chlorine atoms residing on side walls of the trenches of the metallic layer after a trench etching process. The method comprises the following steps: (1) removing the photo resistance layer on top of the metallic layer by ashing at temperatures between 178° C. and 200° C. after a trench etching process, (2) using an acidic solution comprising hydroxylamine ($NH_2OH$), hydroquinone $C_6H_4(OH)_2$, monoethanolanine ($HOCH_2CH_2NH_2$) and water to wash off residues on the surface of the semiconductor chip, and (3) heating the semiconductor chip for a predetermined time period at temperatures between 200° C. and 250° C. so as to completely dissipate the chlorine atoms resided on the side walls of the metallic layer for preventing recurrent corrosion of an aluminum-containing metallic layer.

10 Claims, 2 Drawing Sheets

METHOD FOR PREVENTING CORROSION OF A METALLIC LAYER OF A SEMICONDUCTOR CHIP

BACKGROUND OF THE INVENTION

1. Field of the Invention

The present invention relates to a method for preventing corrosion of a metallic layer of a semiconductor chip, and more particularly, to a method for preventing recurrent corrosion of an aluminum-containing metallic layer of a semiconductor chip caused by residual chlorine atoms.

2. Description of the Prior Art

In semiconductor processing, aluminum is the conductive material prevalently used due to its high conductivity, low cost, ease of deposition and etching, and its strong adhesion to $S_iO_2$. In almost all semiconductor chips the inter-element runners are made of aluminum. Integration of internal elements of the semiconductor chip continues to become more dense and the connection pathways between elements are required to be finer. Therefore, using pure aluminum has the following shortcomings:

(1) There is a certain solid solubility factor between silicon and aluminum such that the inter-diffusion between the two types of atoms in the semiconductor chip becomes very pronounced once the processing temperature exceeds 400° C. causing a spiking phenomenon to occur. This leads to problems in the contact between the aluminum runner and the MOS element. Short-circuiting may then occur.

(2) Most aluminum runners in a semiconductor chip have a poly-cyrstalline structure making them highly susceptible to conductive current which causes aluminum atoms in the runner to move along the grain boundary. This is known as electro-migration and, if severe, may result in complete opening of the aluminum runner.

Hence, an Al-Si-Cu alloy containing 1% Si and 0.5–4.0% Cu by weight is popularly used in the processing of very large scale integration circuits. This effectively prevents the above mentioned problem from occurring.

However, regardless of whether pure aluminum or an Al-Si-Cu alloy is used, there is still the possibility of corrosion of the aluminum constituent caused by residual chlorine atoms. Please refer to FIG. 1 and FIG. 2. FIG. 1 is the chemical reaction formula of a reactive ion etching of an aluminum-containing metallic layer with chloride and chlorine ($Cl_2$). FIG. 2 is the chemical reaction formulas of the recurrent corrosion of the aluminum constituent shown in formula I in FIG. 1. Currently, a reactive ion etching (RIE) process is used in semiconductor processing on an aluminum-containing metallic layer. The process uses a mixed gas with chloride (such as $SiCl_4$, $BCl_3$ and $CCl_4$) and chlorine. As the formula in FIG. 1 illustrates, Al is converted into volatile aluminum chloride ($AlCl_3$) in the etching of the aluminum-containing metallic layer. $AlCl_3$ is then evacuated. Often after etching, the surface of the aluminum-containing metallic layer still contains residual $AlCl_3$ or chlorine. The residual chlorine atoms will interact with the aluminum atoms in the aluminum-containing metallic layer to produce anhydrous aluminum chloride ($AlCl_3$), white or yellowish hexagonal crystals formed on the surface of the aluminum-containing metallic layer. If the environment is damp anhydrous aluminum chloride ($AlCl_3$) will interact with water molecules to generate HCl according to chemical reaction formulas II and III shown in FIG. 2, then HCl will react with the aluminum-containing metallic layer, according to the chemical reaction formula IV shown in FIG. 2 to generate anhydrous aluminum chloride ($AlCl_3$). This causes corrosion of the aluminum-containing metallic layer.

In the RIE process above, the chemical reaction of chlorine and aluminum (formula I) on the aluminum-containing metallic layer 14 is isotropic, so when etching the aluminum-containing metallic layer 14, chloride and chlorine gas (such as a mixed gas of $BCl_3$ and $Cl_2$) is necessary to enhance the anisotropic etching ability of the plasma on the aluminum-containing metallic layer 14. Also, in this RIE process, a small amount of carbon tetrafluoride ($CF_4$) or fluoroform ($CHF_3$) is added into the plasma of $BCl_3$ and $Cl_2$ in order to form a polymer film to cover the surface of the side-wall of the aluminum-containing metallic layer to reduce the interaction between chlorine atoms and aluminum atoms on the side-wall of the aluminum-containing metallic layer following etching. This further improves the anisotropic etching of the plasma of $BCl_3$ and $Cl_2$ on the aluminum-containing metallic layer.

These methods of improving anisotropic etching on the aluminum-containing metallic layer causes an increase in chlorine atom-containing residues left on the aluminum-containing metallic layer. During etching of the side-wall of the aluminum-containing metallic layer or the polymer film, a small amount of $AlCl_3$ or chlorine-containing polymer molecules easily adheres to the surface of the etched side-wall of the aluminum-containing metallic layer. This causes recurrent corrosion of the aluminum-containing metallic layer.

SUMMARY OF THE INVENTION

It is therefore a primary objective of the present invention to provide a method of preventing corrosion of the aluminum-containing metallic later caused by residual chlorine atoms in which a photo resistance layer is removed after trench etching an aluminum-containing metallic layer.

In a preferred embodiment, the present invention provides a method for preventing corrosion of an aluminum-containing metallic layer having a plurality of trenches on the surface of a semiconductor chip caused by chlorine atoms resided on side walls of the trenches of the metallic layer after a trench etching process, the method comprising the following steps:

(1) removing the photo resistance layer on top of the metallic layer by ashing at temperatures between 178° C. and 200° C. after a trench etching process;

(2) using an acidic solution comprising hydroxylamine ($NH_2OH$), hydroquinone $C_6H_4(OH)_2$, monoethanolamine ($HOCH_2CH_2NH_2$) and water to wash off residues on the surface of the semiconductor chip; and (3) heating the semiconductor chip for a predetermined time period at temperatures between 200° C. and 250° C. so as to completely dissipate the chlorine atoms resided on the side walls of the metallic layer for preventing recurrent corrosion of an aluminum-containing metallic layer caused by chlorine atoms residual.

It is an advantage of the present invention that it can completely dissipate the chlorine atoms residing on the side walls of the metallic layer and prevent recurrent corrosion of an aluminum-containing metallic layer caused by residual chlorine atoms.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
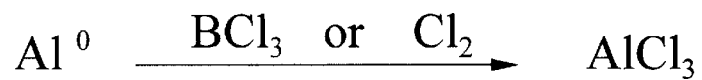
FIG. 1 is the chemical reaction formula of a reactive ion etching of an aluminum-containing metallic layer with chloride and chlorine.
Figure 2:
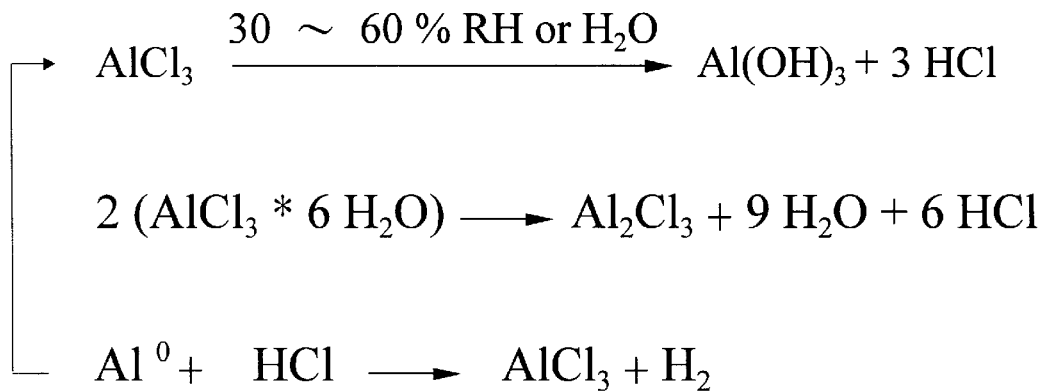
FIG. 2 is the chemical reaction formulas of the recurrent corrosion of the aluminum constituent showed in the formula of FIG. 1.
Figure 3:
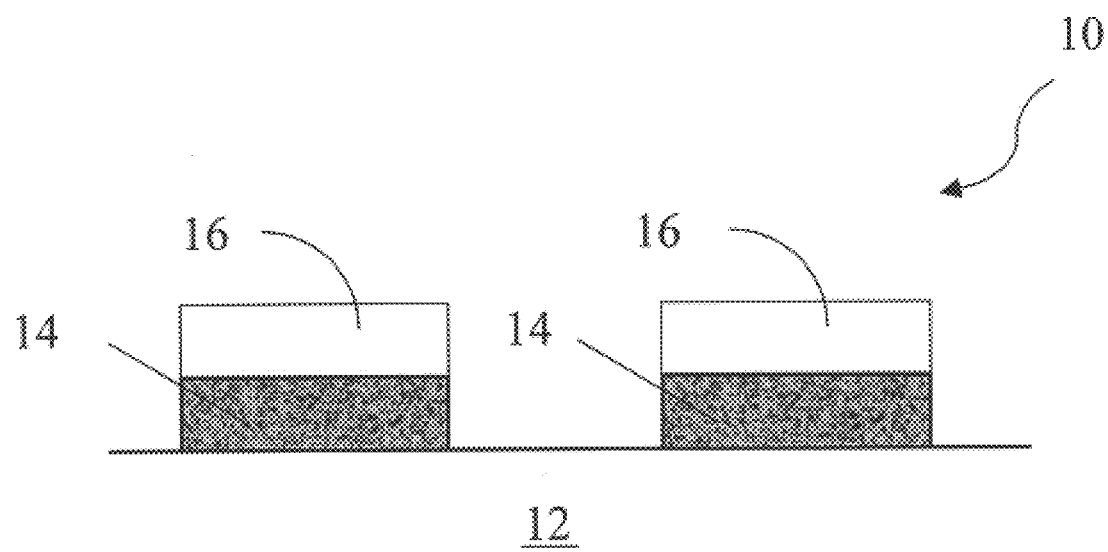
FIG. 3 is a schematic diagram of an aluminum-containing metallic layer at the conclusion of a trench etching process according to the present invention.
Figure 4:
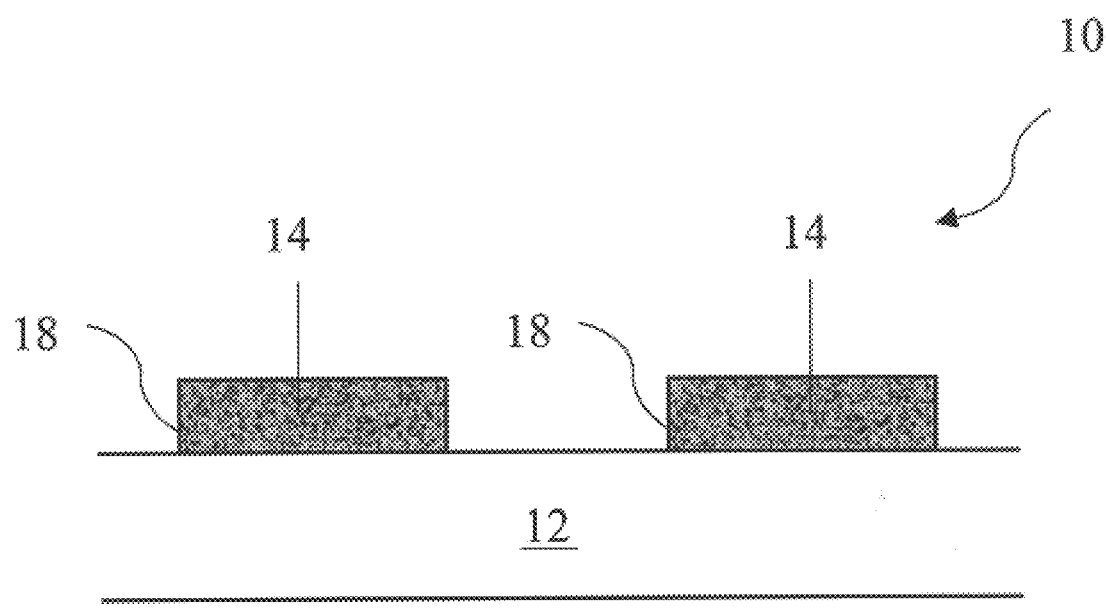
FIG. 4 is a schematic diagram of an aluminum-containing metallic layer shown in FIG. 3 at the conclusion of a photo resistance layer removing process.

Please refer to FIG. 3 and FIG. 4. FIG. 3 is a schematic diagram of an aluminum-containing metallic layer 14 on the surface of a semiconductor chip 10 at the conclusion of a trench etching process according to the present invention. FIG. 4 is a schematic diagram of an aluminum-containing metallic layer 14 shown in FIG. 3 at the conclusion of a photo resistance layer removing process. The semiconductor chip 10 comprises a silicon substrate 12, an aluminum-containing metallic layer 14 formed over the substrate 12, and a photo resistance layer 16 deposited over the surface of the aluminum-containing metallic layer 14. The aluminum-containing metallic layer 14 is made of an alloy of Al and Cu with over 95% Al by weight. In processing the semiconductor chip 10, a desired pattern is first transferred onto the photo resistance layer 16 by photolithography then the semiconductor chip 10 is placed into a vacuum chamber where RIE processing is performed through the use of chloride and chlorine gas thus completing the etching of the aluminum-containing metallic layer 14. This layer is the conducting layer.

Anhydrous aluminum chloride may be formed by interaction of chlorine atoms remaining on the surface of the aluminum-containing metallic layer 14 with aluminum atoms. Furthermore, if a damp environment exists, anhydrous aluminum chloride may cause recurrent corrosion of the aluminum-containing metallic layer 14. Therefore, residual chlorine atoms are simultaneously removed in the next process.

After the trench etching process of the aluminum-containing metallic layer 14 is complete, ashing is performed using plasma on the semiconductor chip 10 to remove the photo resistance layer 16 as a mask over the aluminum-containing metallic layer 14 and removing the chlorine atoms on the surface of the aluminum-containing metallic layer 14. The ashing process is performeded at temperatures between 178° C. to 200° C. using a low pressure mixed gas of chlorine ($Cl_2$), boron trichloride ($BCl_3$), nitrogen ($N_2$), and argon (Ar). The high temperature of the ashing process is the first such high temperature process of this invention.

After the ashing process, an acidic solution comprising hydroxylamine ($NH_2OH$), hydroquinone $C_6H_4(OH)_2$, monoethanolanine ($HOCH_2CH_2NH_2$) and water is used as a cleaning process to wash residues from the surface of the semiconductor chip 10.

Finally the semiconductor chip 10 is placed on a hot plate in a heating system for continuous hot baking so as to finish the second high temperature process. The second high temperature process is performed at temperatures between 200° C. to 250° C. for approximately 1 to 2 minutes. In this way, the organic molecules left on the surface of the semiconductor chip 10 become volatile and the source of residual chlorine atoms is eliminated from the surface of the semiconductor chip 10. This prevents corrosion of the aluminum-containing metallic layer 14.

When RIE is performed in the dry etching process of the aluminum-containing metallic layer 14, a mixed gas of $BCl_3$ and $Cl_2$ must be added. Carbon tetrafluoride ($CF_4$) or fluoroform ($CHF_3$) may be added into the plasma of $BCl_3$ and $Cl_2$ to enhance the anisotropic etching ability of the plasma on the aluminum-containing metallic layer 14. These methods improve anisotropic etching on the aluminum-containing metallic layer 14 but cause more chlorine atom containing residues to reside on the etched side-wall 18 of the aluminum-containing metallic layer 14. In the method of the present invention, the 178° C. to 200° C. first high temperature process causes residual chlorine atoms on the aluminum-containing metallic layer 14 to dissipate. Remaining residues left on the surface of the semiconductor chip 10 are washed with an acidic solution. Heating for 1 to 2 minutes during the second high temperature process will make the crystal on the surface of the aluminum-containing metallic layer 14 to sublime out from the surface of the semiconductor chip 10. This prevents the recurrent corrosion of the aluminum-containing metallic layer 14.

Also, during processing in which there is low accuracy or a wider line width, one would only need to use plasma at high temperatures of 178° C. to 200° C. as well as the organic solution used in the cleaning process to remove the photo resistance layer 16 from the surface of the semiconductor chip 10. The second high temperature process of hot baking at temperatures between 200° C. to 250° C. may be omitted. The anhydrous aluminum chloride ($AlCl_3$) crystals will sublime into gaseous $AlCl_3$ at a temperature of 178° C. Therefore, in the plasma ashing process when the temperature is 178° C. to 200° C., not only will the photo resistance layer 16 on the surface of the aluminum-containing metallic layer 14 be dissolved and removed, but also nearly all of the $AlCl_3$ molecules in the chamber will be volatile and thus will be removed from the surface of the semiconductor chip 10 by the evacuating system. Next the final cleaning process is performed with an acidic solution comprising hydroxylamine ($NH_2OH$), hydroquinone $C_6H_4(OH)_2$, monoethanolanine ($HOCH_2CH_2NH_2$) and water to wash off residues from the surface of the semiconductor chip 10. In this way, corrosion of the aluminum-containing metallic layer 14 of the semiconductor chip 10 is easily prevented.

The method of the present invention uses the ashing process to remove the photo resistance layer after a trench etching process of the aluminum-containing metallic layer 14. Ashing is performed at temperatures between 178° C. to 200° C. Next, residues remaining on the surface of the semiconductor chip are washed using an organic solution. The semiconductor chip is then heated to temperatures between 200° C. to 250° C. for a predetermined time period so as to completely dissipate the chlorine atoms residing on the side walls of the metallic layer. This prevents recurrent corrosion of the aluminum-containing metallic layer 14 caused by residual chlorine atoms.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for preventing corrosion of an aluminum-containing metallic layer having a plurality of trenches on the surface of a semiconductor chip caused by chlorine atoms resided on side walls of the trenches of the metallic layer after a trench etching process, the method comprising the following steps:

eliminating a photo resistance layer on the top of the metallic layer at high temperature by an ashing process with a mixed gas which contains chlorine ($Cl_2$), boron trichloride ($BCl_3$), nitrogen ($N_2$), and argon (Ar) so as to completely dissipate the chlorine atoms residue on the side walls of the metallic layer; and using an organic solution to wash off residues left on the surface of the semiconductor chip.

2. The method of claim 1 wherein the photo resistance layer on top of the metallic layer is removed at temperatures between 178° C. and 200° C. by ashing so that the chlorine atoms resided on the side walls of the metallic layer can be simultaneously dissipated.

3. The method of claim 1 wherein the organic solution is an acidic solution comprising hydroxylamine ($NH_2OH$), hydroquinone ($C_6H_4(OH)_2$), monoethanolanine ($HOCH_2CH_2NH_2$) and water.

4. The method of claim 1 wherein the metallic layer comprises aluminum alloy formed by aluminum and copper, and the weight of the aluminum in the aluminum alloy is more than 95% of the overall weight.

5. The method of claim 4 wherein the chlorine atoms resided on the side walls of the aluminum alloy can interact with the aluminum atoms in the aluminum alloy to generate anhydrous $AlCl_3$, and the interaction can be automatically repeated to generate more anhydrous in a damp environment thus resulting in corrosion of the aluminum alloy.

6. A method for preventing corrosion of an aluminum-containing metallic layer having a plurality of trenches on the surface of a semiconductor chip caused by chlorine atoms resided on side walls of the trenches of the metallic layer after a trench etching process, the method comprising the follow steps:

removing a photo resistance layer on top of the metallic layer by an ashing process with a mixed gas which contains chlorine ($Cl_2$), boron trichloride ($BCl_2$), nitrogen ($N_2$), and argon (Ar);

using an organic solution to wash off residues on the surface of the semiconductor chip;

heating the semiconductor chip at temperatures between 200° C. and 250° C. so as to completely dissipate the chlorine atoms resided on the side walls of the metallic layer.

7. The method of claim 6 wherein the organic solution is an acidic solution comprising hydroxylamine ($NH_2OH$), hydroquinone $C_6H_4(OH)_2$, monoethanolanine ($HOCH_2CH_2NH_2$) and water.

8. The method of claim 6 wherein the semiconductor chip is heated for approximately 1 to 2 minutes.

9. The method of claim 6 wherein the metallic layer comprises aluminum alloy formed by aluminum and copper, and the weight of the aluminum in the aluminum alloy is more than 95% of the overall weight.

10. The method of claim 9 wherein the chlorine atoms resided on the side walls of the aluminum alloy can interact with the aluminum atoms in the aluminum alloy to generate anhydrous $AlCl_3$, and the interaction can be automatically repeated to generate more anhydrous $AlCl_3$ in a damp environment thus resulting in corrosion of the aluminum alloy.

* * * * *